(12) United States Patent
Kim et al.

(10) Patent No.: US 8,599,539 B2
(45) Date of Patent: Dec. 3, 2013

(54) CERAMIC CHIP ASSEMBLY

(75) Inventors: Sun-Ki Kim, Gunpo-si (KR); Seong-Jin Lee, Gunpo-si (KR); Ki-Han Park, Ansan-si (KR)

(73) Assignees: Joinset Co., Ltd. (KR); Sun-Ki Kim (KR)

( * ) Notice: Subject to any disclaimer, the term of this patent is extended or adjusted under 35 U.S.C. 154(b) by 133 days.

(21) Appl. No.: 13/193,836

(22) Filed: Jul. 29, 2011

(65) Prior Publication Data

US 2012/0026659 A1    Feb. 2, 2012

(30) Foreign Application Priority Data

Jul. 30, 2010  (KR) .................. 10-2010-0074409
Aug. 19, 2010 (KR) .................. 10-2010-0080478

(51) Int. Cl.
*H05K 7/00*    (2006.01)
*H05K 3/10*    (2006.01)

(52) U.S. Cl.
USPC ............. 361/679.01; 257/788; 257/E23.116; 257/E23.126; 361/301.3; 361/308.2; 361/320; 361/321.1; 361/600; 361/716; 361/766; 428/209; 428/210

(58) Field of Classification Search
USPC ........ 257/788, E23.116, E23.126; 361/303.1, 361/308.2, 320, 321.1, 600, 679.01, 716, 361/766, 788; 428/209, 210
See application file for complete search history.

(56) References Cited

U.S. PATENT DOCUMENTS

| | | | | |
|---|---|---|---|---|
| 3,310,719 A | * | 3/1967 | Seney | 361/321.1 |
| 3,824,328 A | * | 7/1974 | Ting et al. | 174/524 |
| 3,838,316 A | * | 9/1974 | Brown et al. | 361/679.01 |
| 4,804,805 A | * | 2/1989 | Antonas et al. | 174/524 |
| 6,025,556 A | * | 2/2000 | Yoshimura et al. | 174/524 |
| 2007/0040646 A1 | * | 2/2007 | Peinsipp et al. | 338/257 |

FOREIGN PATENT DOCUMENTS

| | | |
|---|---|---|
| JP | 2006-60027 A | 3/2006 |
| JP | 2009-192424 A | 8/2009 |
| KR | 10-0734788 B1 | 7/2007 |
| KR | 10-2010-0040241 A | 4/2010 |

* cited by examiner

*Primary Examiner* — Peniel M Gumedzoe
(74) *Attorney, Agent, or Firm* — Park & Associates IP Law, P.C.

(57) ABSTRACT

Provided is a ceramic chip assembly configured to economically and reliably insulate an exposed portion of a metal lead wire from an environmental change. The ceramic chip assembly includes a ceramic base having electrical characteristics, a pair of external electrodes that are disposed on a pair of surfaces of the ceramic base, respectively, the surfaces of the ceramic base being opposed to each other, a pair of metal lead wires as single cores having first ends that are electrically and mechanically connected to the external electrodes, respectively, by an electrical conductive adhesive member, an insulation sealant sealing the ceramic base, the external electrodes, and the first ends of the metal lead wires to expose second ends of the metal lead wires, and an insulation polymer coating layer continuously formed on both the insulation sealant and portions of the metal lead wires exposed out of the insulation sealant.

16 Claims, 6 Drawing Sheets

CERAMIC CHIP ASSEMBLY

REFERENCE TO RELATED APPLICATIONS

This application claims the priority benefit of Korean Patent Application No. 10-2010-0074409 filed on Jul. 30, 2010 and Korean Patent Application No. 10-2010-0080478 filed on Aug. 19, 2010, the entire contents of which are incorporated herein by reference.

FIELD OF THE INVENTION

The present invention relates to a ceramic chip assembly, and more particularly, to a ceramic chip assembly configured to economically and reliably insulate an exposed portion of a metal lead wire from an environmental change and to economically and reliably protect a ceramic chip in the ceramic chip assembly from an environmental change.

BACKGROUND OF THE INVENTION

A ceramic chip having electrical characteristics of semiconductors such as thermistors, magnetic substances, and piezoelectrics, or a ceramic chip having electrical characteristics of dielectrics such as capacitors may be installed on a printed circuit board (PCB). To this end, for example, a metal lead wire or a metal lead frame may be soldered to an electrode of a ceramic chip, then, an insulation sealant may be formed on a portion connecting the ceramic chip to the lead wire or lead frame, then, a heat shrinkable tube may be fitted on an exposed portion of the lead wire or lead frame to form a ceramic chip assembly with the lead wire or lead frame electrically insulated except for its end, and then, the uninsulated end is soldered to a conductive pattern of a PCB, thereby electrically and mechanically connecting the ceramic chip and the PCB to each other. Alternatively, wires facing exposed ends of the lead wire of the ceramic chip assembly may be soldered or welded thereto, and thus, be electrically connected thereto.

Electrical and mechanical connection of such a ceramic chip assembly to a PCB should be facilitated, and the ceramic chip assembly should be lightweight, slim, compact, economical, and resistant to environment.

In addition, an insulating sealant should reliably seal and protect a ceramic chip and a lead wire from environment.

In addition, an exposed portion of a lead wire except for a portion to be soldered should be reliably insulated by an insulating material.

In addition, an exposed portion of a lead wire except for a portion to be soldered should be thin, flexible, and economically insulated.

In addition, an exposed portion of a lead wire except for a portion to be soldered should be insulated to be free from a crack due to bending.

Figure 1:
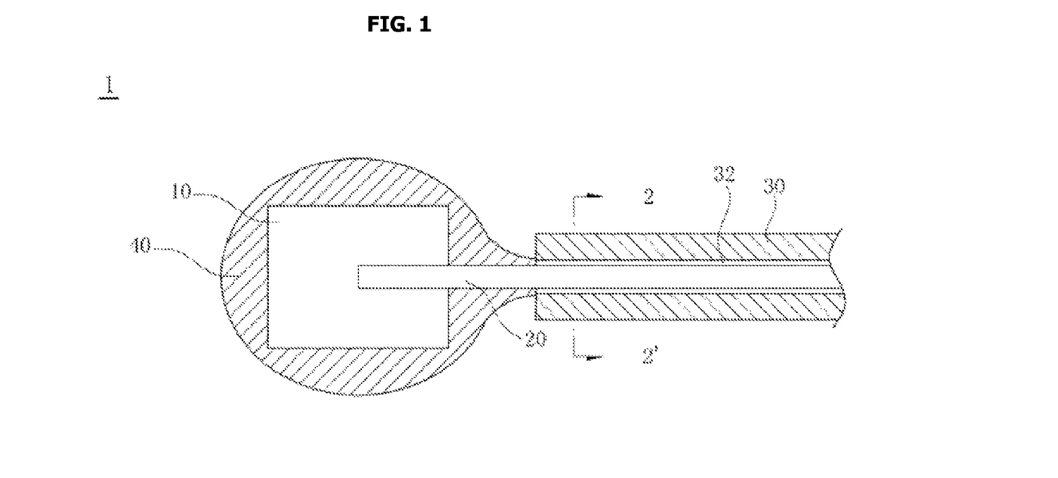
FIG. 1 is a cross-sectional view illustrating a ceramic chip assembly in the related art.
Figure 2:
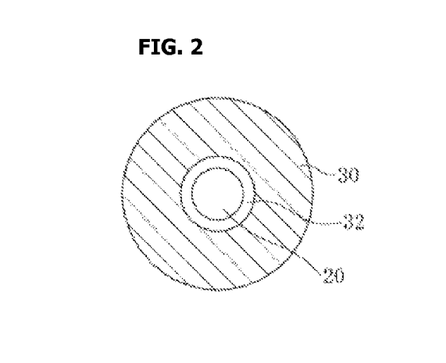
FIG. 2 is a cross-sectional view taken along line 2-2' of FIG. 1.

FIG. 1 is a cross-sectional view illustrating a ceramic chip assembly in the related art. FIG. 2 is a cross-sectional view taken along line 2-2' of FIG. 1.

Referring to FIG. 1, in a ceramic chip assembly 1, a cylindrical metal lead wire 20 is soldered to a ceramic chip 10, and is electrically insulated by an insulation sealant 40 such as an epoxy resin or glass. Although one wire as the lead wire 20 is illustrated in FIG. 1 that is a side cross-sectional view, the lead wire 20 is provided in a pair.

An exposed portion of the lead wire 20 connected to the ceramic chip 10 is exposed out of the insulation sealant 40, and is fitted in an insulation tube 30 that includes one of a PVC tube, a polyimide tube, or a Teflon tube.

As such, the exposed portion of the lead wire 20 out of the insulation sealant 40 is electrically protected by the insulation tube 30. When the exposed portion of the lead wire 20 is long, insulation of the exposed portion is important. For example, unless the exposed portion of the lead wire 20 is reliably insulated, an unnecessary contact between the ceramic chip assembly 1 and an adjacent part may occur, or moisture or water may be introduced to the ceramic chip 10 along the exposed portion of the lead wire 20. In particular, since an electrical performance of the ceramic chip 10 having electric characteristics of a semiconductor such as a thermistor is varied by moisture or water, the exposed portion of the lead wire 20 should be reliably insulated to prevent introduction of moisture and water to the ceramic chip 10 along the lead wire 20.

Referring to FIG. 2, since the insulation tube 30 receiving the lead wire 20 has a hole 32 with an inner diameter greater than the outer diameter of the lead wire 20, a space 32 formed between the insulation tube 30 and the lead wire 20 loosens coupling of the insulation tube 30 and the lead wire 20, and thus, the insulation tube 30 may be moved from a predetermined area of the lead wire 20, thereby degrading the workability of a subsequent process and requiring an additional process. Although the lead wire 20 is disposed in the center of the space 32 in FIG. 2, the lead wire 20 may be misaligned with the space 32.

Since the space 32 is disposed between the lead wire 20 and the insulation tube 30, water or moisture may be introduced to the ceramic chip 10 along the lead wire 20.

In addition, since the insulation tube 30 having a certain outer diameter is fitted on the lead wire 20, automation may be difficult, and manufacturing costs may be increased.

In addition, since the insulation tube 30 is thick, slimming of the ceramic chip assembly 1 may be difficult.

In addition, moisture or water may be introduced along a boundary between the insulation sealant 40 and the lead wire 20.

Alternatively, a heat shrinkable tube having an inner diameter greater than the outer diameter of the lead wire 20 may be fitted on the lead wire 20 and be shrunken by heat to insulate the exposed portion of the lead wire 20. However, in this case, since the heat shrinkable tube is shrunken by heat, automation may be difficult, and thus, manufacturing costs may be increased.

In addition, since the space 32 is formed between the lead wire 20 and the heat shrinkable tube, water or moisture may be introduced to the ceramic chip 10 along the lead wire 20.

In addition, since the heat shrinkable tube is thick, slimming of the ceramic chip assembly 1 may be difficult.

In addition, moisture or water may be introduced along a boundary between the insulation sealant 40 and the lead wire 20.

Figure 3A:
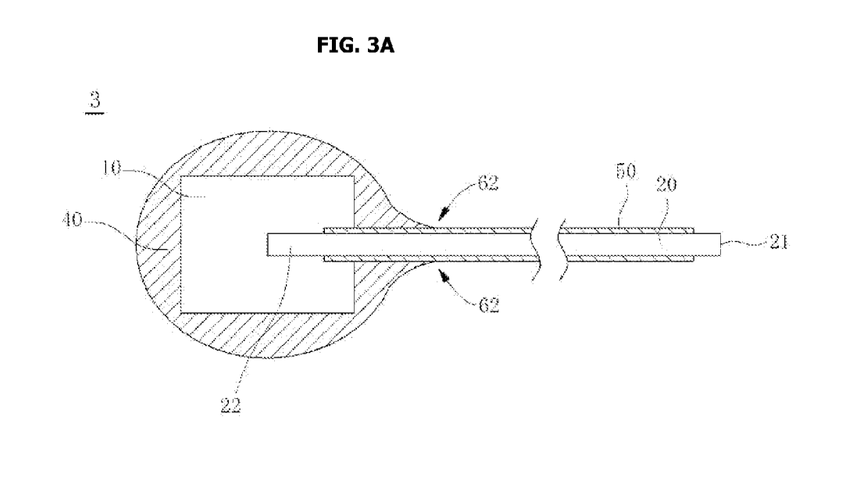
FIGS. 3A and 3B are cross-sectional views illustrating ceramic chip assemblies in the related art.
Figure 3B:
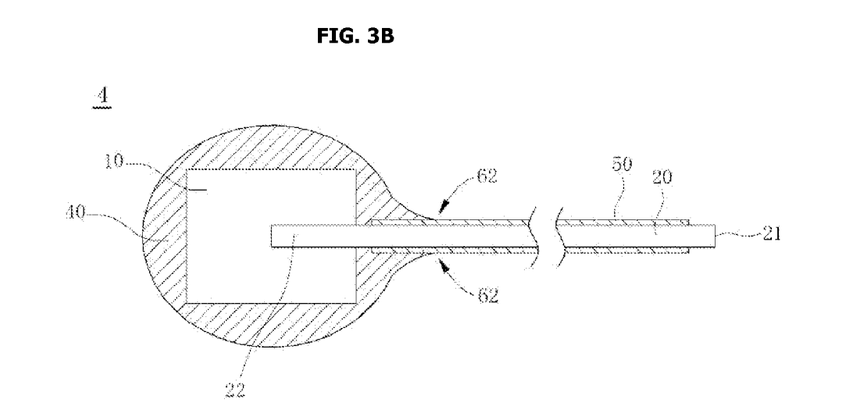

Alternatively, referring to FIGS. 3A and 3B, ceramic chip assemblies 3 and 4 include a thin insulation polymer coating layer 50 on the rest of the lead wire 20 except for both ends 21 and 22 of the lead wire 20. The insulation polymer coating layer 50 having a constant small thickness is continuously formed on the lead wire 20 to form an insulation wire such as an enamel wire, then, the insulation polymer coating layer 50 is partially removed from the ends 21 and 22 by heat, and then, the ceramic chip 10 is connected to the end 22 through an electrical adhesive member such as a soldering material, and is sealed by the insulation sealant 40, thereby forming the ceramic chip assemblies 3 and 4.

However, to this end, an enamel wire formed by continuously forming the insulation polymer coating layer 50 having a constant small thickness on the lead wire 20 is cut to a constant length, then, the insulation polymer coating layer 50 is partially removed from the ends 21 and 22 of the enamel wire, then, the ceramic chip 10 is manually soldered to the end 22, and then, the insulation sealant 40 is formed thereon. Thus, automation may be difficult, costs may be increased, and quality may be unstable.

In addition, moisture or water may be introduced along a boundary between the insulation sealant 40 and the insulation polymer coating layer 50.

In addition, there is no member for protecting the insulation sealant 40.

SUMMARY OF THE INVENTION

An object of the present invention is to provide a ceramic chip assembly configured to minimize a gap between an exposed portion of a metal lead wire and an insulation sealant.

Another object of the present invention is to provide a ceramic chip assembly including a thin and flexible insulation polymer coating layer.

Another object of the present invention is to provide a ceramic chip assembly having high peel strength to prevent introduction of water or moisture to a ceramic chip along a lead wire.

Another object of the present invention is to provide a ceramic chip assembly configured to further protect an insulation sealant.

Another object of the present invention is to provide a ceramic chip assembly configured to ensure productivity even when a metal lead wire has a long exposed portion.

Another object of the present invention is to provide a ceramic chip assembly in which two metal lead wires can be spread without affecting a ceramic bare chip.

Another object of the present invention is to provide a ceramic chip assembly that is continuously fed to a reel taping process using carrier tape, thereby improving automation and productivity.

Another object of the present invention is to provide a ceramic chip assembly that is reliably accommodated in a metal can.

According to an aspect of the present invention, there is provided a ceramic chip assembly including: a ceramic base having electrical characteristics; a pair of external electrodes that are disposed on a pair of surfaces of the ceramic base, the surfaces of the ceramic base being opposed to each other, respectively; a pair of metal lead wires as single cores having first ends that are electrically and mechanically connected to the external electrodes, respectively, by an electrical conductive adhesive member; an insulation sealant sealing the ceramic base, the external electrodes, and the first ends of the metal lead wires to expose second ends of the metal lead wires; and an insulation polymer coating layer continuously formed on both the insulation sealant and portions of the metal lead wires exposed out of the insulation sealant, wherein the insulation polymer coating layer is formed by dipping the insulation sealant and the portions of the metal lead wires into a liquid insulation polymer resin used for forming the insulation polymer coating layer, taking out the insulation sealant and the portions of the metal lead wires, and curing the liquid insulation polymer resin formed on the insulation sealant and the portions of the metal lead wires, and the insulation polymer coating layer has different thicknesses in both a portion adjacent to the second ends of the metal lead wires and a portion adjacent to the insulation sealant.

According to another aspect of the present invention, there is provided a ceramic chip assembly including: a ceramic base having electrical characteristics; a pair of external electrodes that are disposed on a pair of surfaces of the ceramic base, respectively, the surfaces of the ceramic base being opposed to each other; a pair of metal lead wires as single cores having first ends that are electrically and mechanically connected to the external electrodes, respectively, by an electrical conductive adhesive member; an insulation sealant sealing the ceramic base, the external electrodes, and the first ends of the metal lead wires to expose second ends of the metal lead wires; and an insulation polymer coating layer continuously formed on both the insulation sealant and portions of the metal lead wires exposed out of the insulation sealant; a metal can accommodating the ceramic chip assembly; and a second insulation sealant sealing the metal can and the ceramic chip assembly, wherein the insulation polymer coating layer is formed by dipping the insulation sealant and the portions of the metal lead wires into a liquid insulation polymer resin used for forming the insulation polymer coating layer, taking out the insulation sealant and the portions of the metal lead wires, and curing the liquid insulation polymer resin formed on the insulation sealant and the portions of the metal lead wires, and the insulation polymer coating layer has different thicknesses in both a portion adjacent to the second ends of the metal lead wires and a portion adjacent to the insulation sealant.

The thickness of the insulation polymer coating layer may increase from the second ends of the metal lead wires toward the insulation sealant.

The dipping may be performed sequentially from the insulation sealant.

The ceramic base may have an electrical performance of one of a thermistor, a capacitor, an inductor, and a piezoelectric.

The insulation polymer coating layer may have lower hardness than that of the insulation sealant, and the insulation polymer coating layer may have better flexibility than that of the insulation sealant.

The insulation polymer coating layer may have certain hardness and flexibility to be free from a crack when the metal lead wires are bent about 90°, and to prevent introduction of water.

An insulation tube may be fitted on the metal lead wires to cover a boundary between a coated portion of the metal lead wires covered with the insulation polymer coating layer and an uncoated portion thereof.

Each of the metal lead wires may be integrally formed, and have one of a circular cross-section, a rectangular cross-section, and a combination thereof.

An outermost layer of the metal lead wires may be plated with one of stannum and silver to facilitate soldering, and have a circular cross-section having an outer diameter ranging from about 0.1 mm to about 0.6 mm.

The insulation polymer coating layer may have an overall length of about 10 mm or greater.

The insulation polymer coating layer covers about 50% or more of the overall length of an exposed portion of the metal lead wires.

The insulation polymer coating layer may include one of epoxy, polyimide, polyamide, polyester, glass, and silicone.

The insulation polymer coating layer may include one of epoxy, polyimide, polyamide, polyester, and silicone.

The insulation sealant may have an average thickness greater than that of the insulation polymer coating layer.

The insulation polymer coating layer may have excellent flexibility and high peel strength.

The insulation polymer coating layer may have a different color from that of the metal lead wires.

The insulation polymer coating layer may be formed by sequentially dipping the insulation sealant and the portions of the metal lead wires into the liquid insulation polymer resin used for forming the insulation polymer coating layer, taking out the insulation sealant and the portions of the metal lead wires, and curing the liquid insulation polymer resin formed on the insulation sealant and the portions of the metal lead wires.

The insulation polymer coating layer may be adhered directly to the insulation sealant and the metal lead wires through the curing.

The insulation polymer coating layer may have a maximum thickness of about 0.3 mm, or the minimum of thicknesses for the metal lead wires to withstand a voltage of about 100 V or higher.

The ceramic chip assembly may be continuously manufactured, inspected, and supplied in the form of reel taping with carrier tape.

The second insulation sealant may be one of materials used for forming the insulation sealant.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE INVENTION

Embodiments of the present invention will be described below in more detail with reference to the accompanying drawings.

Figure 4:
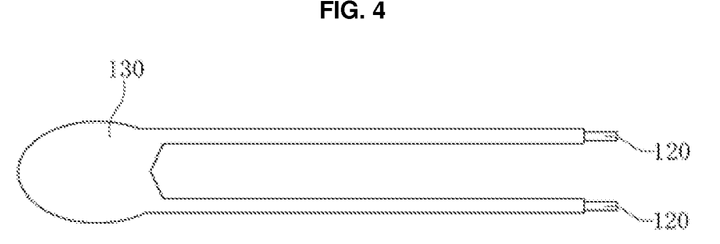
FIG. 4 is a plan view illustrating a ceramic chip assembly according to an embodiment of the present invention.
Figure 5A:
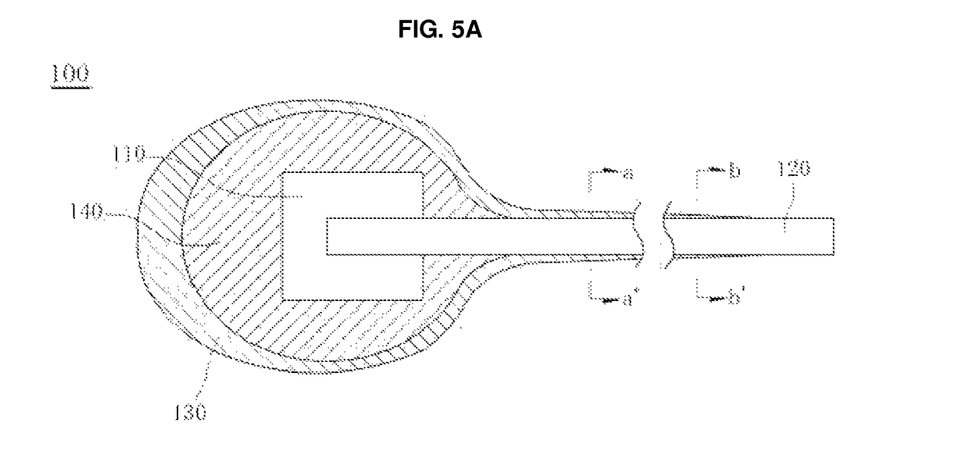
FIG. 5A is a cross-sectional view illustrating the ceramic chip assembly of FIG. 4.
Figure 5B:
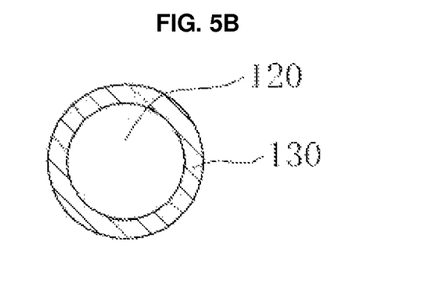
FIG. 5B is a cross-sectional view taken along line a-a' of FIG. 5A.
Figure 5C:
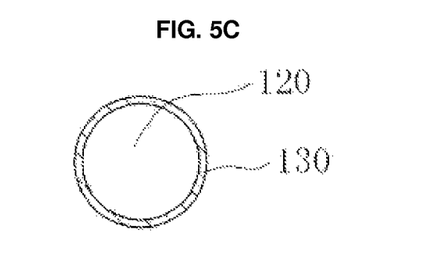
FIG. 5C is a cross-sectional view taken along line b-b' of FIG. 5A.

FIG. 4 is a plan view illustrating a ceramic chip assembly according to an embodiment of the present invention. FIG. 5A is a cross-sectional view illustrating the ceramic chip assembly of FIG. 4. FIG. 5B is a cross-sectional view taken along line a-a' of FIG. 5A. FIG. 5C is a cross-sectional view taken along line b-b' of FIG. 5A.

Referring to FIGS. 4 and 5A, a head accommodating a ceramic chip 110, and a portion of lead wires 120 formed of a metal are surrounded by an insulation polymer coating layer 130, and the rest of a ceramic chip assembly 100 except for an end of the lead wires 120, that is, except for a portion connected to a corresponding conductive material is exposed.

When protruding from the head, the lead wires 120 are bent to increase a distance between the lead wires 120. Alternatively, the distance between the lead wires 120 may be entirely constant.

The ceramic chip 110 includes a hexahedron shaped ceramic base having electrical characteristics, and a plurality of external electrodes disposed on a pair of surfaces opposed to each other, such as outer and inner surfaces, or both side surfaces.

The ceramic chip 110 may have a length of about 1 mm, a thickness of about 0.30 mm, and a width of about 0.5 mm, but is not limited thereto.

For example, the inner and outer surfaces of the ceramic base may be parallel to each other and be planar, and the ceramic base may be one of an inductor, a thermistor, a varistor, a piezoelectric, and a magnetic material, which have electrical characteristics of a semiconductor, or be a capacitor having electrical characteristics of a dielectric.

Referring to FIGS. 4 and 5A, the lead wires 120, each of which is a single core having a circular cross-section, are electrically and mechanically connected to the external electrodes of the ceramic chip 110 through an electrical conductive adhesive member such as solder. The ceramic chip 110 and portions of the lead wires 120 connected thereto are sealed and protected by an insulation sealant 140.

For example, the center of an end of the lead wire 120 may be disposed on a line vertically extending from the center of a surface of the ceramic chip 110. In the case, the upper and lower shapes of the ceramic chip assembly 100 are the same, and thus, productivity thereof can be improved.

The lead wires 120 electrically contact the external electrodes to supply power to the ceramic base, thereby realizing the electrical characteristics of the ceramic base.

The lead wire 120 may be formed of one of copper, a copper alloy, iron, an iron alloy, nickel, and a nickel alloy to have predetermined mechanical strength and electrical conductivity.

For example, the outermost layer of the lead wire 120 may be plated with stannum (Sn) or silver (Ag) to facilitate soldering.

The lead wire 120 may be an integrated single core and have a circular cross-section, to thereby improve adhesive force between the lead wire 120 and the external electrode of the ceramic chip 110, and facilitate automation such as reel taping. When the lead wire 120 has a circular cross-section, distortion of the lead wire 120 is prevented during a continuous manufacturing process, thereby improving workability and facilitating insert of the lead wire 120 into a circular hole of a PCB, and soldering of the lead wire 120. However, the present invention is not limited thereto, and thus, the lead wire 120 may have a rectangular cross-section to facilitate spot welding.

For example, the lead wire 120 may have a circular cross-section that has a diameter ranging from about 0.1 mm to about 0.6 mm, or a rectangular cross-section that has a width W ranging from about 0.5 mm to about 2 mm, and a height H ranging from about 0.05 mm to about 0.3 mm.

For example, the lead wire 120 may be a single core to facilitate workability and automation.

When the lead wire 120 is a single core having a circular cross section, insert and soldering of the lead wire 120 into the circular hole of the PCB such as a via hole are facilitated, and the thickness of the lead wire 120 is constant. Thus, a restoring tendency of the lead wire 120 due to elasticity before a bending threshold after the soldering is small, so that the lead wire 120 can be easily fixed to a certain position, and be resistant to a breakage due to repeated force.

When the ceramic chip assembly 100 is used at low temperature, e.g., at a temperature of 200° C. or lower, the lead wire 120 and the external electrode of the ceramic chip 110 may be electrically and mechanically connected to each other through solder that is economical and convenient to use.

When the ceramic chip assembly 100 is used at high temperature, e.g., at a temperature higher than 200° C., the lead wire 120 and the external electrode of the ceramic chip 110 may be electrically and mechanically connected to each other through thermosetting conductive high temperature epoxy adhesive or using spot welding.

For example, the insulation sealant 140 may be formed through a powder coating process or a liquid dipping process, but is not limited thereto.

For example, the insulation sealant 140 may be formed of one of an epoxy resin, polyimide, polyamide, polyester, silicone, and glass. Since the epoxy resin and the silicone are thermosetting resins that become permanently hard after a single melting and molding, they can be used at high temperature. Moreover, when the insulation sealant 140 is formed of glass, the insulation sealant 140 can be used at higher temperature.

As such, the insulation sealant 140 protects the ceramic chip 110 and the portions of the lead wires 120 connected thereto, from an environmental change.

For example, the insulation sealant 140 may have high hardness, low flexibility, and excellent peel strength to the lead wire 120 to physically and electrically protect a connecting portion between the ceramic chip 110 and the lead wire 120 from external physical impact and moisture.

A portion of the insulation sealant 140 between the lead wires 120 prevents force for spreading ends of the lead wires 120 from being transmitted to a soldered portion, thereby protecting the connecting portion between the ceramic chip 110 and the lead wire 120.

Referring to FIG. 5A, the insulation polymer coating layer 130 is continuously disposed on the insulation sealant 140 and certain portions of the lead wires 120 exposed out of the insulation sealant 140.

The insulation polymer coating layer 130 may have any hardness and any thickness. For example, the insulation polymer coating layer 130 may have certain hardness and certain thickness to maintain a bending state of the lead wire 120 at about 90° and prevent a crack on the insulation polymer coating layer 130.

The insulation polymer coating layer 130 is adhered to the lead wire 120 with peel strength that is resistant to a fingernail.

The insulation polymer coating layer 130 is adhered to the lead wire 120 to sufficiently insulate the lead wire 120 and prevent introduction of moisture or water to the ceramic chip 110 along the lead wire 120.

For example, the insulation polymer coating layer 130 may have lower hardness and better flexibility than those of the insulation sealant 140. Thus, even when bending and unbending of the lead wire 120 are repeated, a crack can be prevented on the insulation polymer coating layer 130.

For example, the insulation polymer coating layer 130 may be formed by dipping the insulation sealant 140 and certain portions of the lead wires 120 into a liquid insulation polymer resin including one of epoxy, polyimide, polyamide, polyester, urethane, and silicone, coating the insulation sealant 140 and the certain portions of the lead wire 120 with the liquid insulation polymer resin, and curing the liquid insulation polymer resin.

For example, the thickness of the insulation polymer coating layer 130 may be different in a portion adjacent to the uncoated end of the lead wire 120 and a portion adjacent to the insulation sealant 140.

For example, the thickness of the insulation polymer coating layer 130 may increase from the uncoated end of the lead wire 120 and to the insulation sealant 140.

For example, the insulation polymer coating layer 130 on a portion of the lead wire 120 exposed out of the insulation sealant 140 may have a maximum thickness of about 0.3 mm to provide certain flexibility to the portion of the lead wire 120.

For example, the insulation polymer coating layer 130 on the portion of the lead wire 120 exposed out of the insulation sealant 140 may have a thickness for the lead wire 120 to withstand a voltage of about 100 V or higher.

When the insulation polymer coating layer 130 has certain heat resistance, the lead wire 120 can be free from deformation due to soldering or spot welding.

The insulation polymer coating layer 130 is adhered directly to the lead wire 120 and the insulation sealant 140 through curing.

The insulation polymer coating layer 130 may have a different color from that of the lead wire 120, to thereby efficiently check with the naked eye whether the insulation polymer coating layer 130 is reliably disposed on the lead wire 120.

As such, in the ceramic chip assembly 100, the whole of the insulation sealant 140 that has higher hardness and poorer flexibility, and the portion of the lead wire 120 exposed out of the insulation sealant 140 are covered with and attached to the insulation polymer coating layer 130 that has lower hardness, better flexibility, and is thin.

For example, after a dipping process, the insulation polymer coating layer 130 increases in thickness toward the insulation sealant 140 from the portion of the lead wire 120 exposed out of the insulation sealant 140.

As such, the ceramic chip assembly 100 includes the insulation polymer coating layer 130 that is continuously disposed on the insulation sealant 140 and the portions of the lead wires 120 exposed out of the insulation sealant 140. The insulation polymer coating layer 130 may be formed by sequentially dipping the insulation sealant 140 and the portions of the lead wires 120 into a liquid insulation polymer resin used for forming the insulation polymer coating layer 130, and curing the liquid insulation polymer resin formed on the insulation sealant 140 and the portions of the lead wires 120. For example, the thickness of the insulation polymer coating layer 130 may be different in the portion adjacent to the uncoated end of the lead wire 120 and the portion adjacent to the insulation sealant 140.

The ceramic chip assembly 100 as illustrated in FIG. 5A has the following effects.

Firstly, the insulation polymer coating layer 130 is integrally adhered to the boundary between the insulation sealant 140 and the portions of the lead wires 120 exposed out of the insulation sealant 140, thereby preventing introduction moisture or water to the ceramic chip 110 through the boundary.

Secondly, since the insulation sealant 140 and the portions of the lead wires 120 exposed out of the insulation sealant 140 are coated with the insulation polymer coating layer 130 that has lower hardness and better flexibility than those of the insulation sealant 140 and is thin, the lead wire 120 that is thin can be efficiently applied to a desired position.

Thirdly, the insulation polymer coating layer 130, which has low hardness and excellent flexibility and is formed on the portion of the lead wire 120 exposed out of the insulation sealant 140, reliably insulates the lead wire 120 without a crack in a bending test with an angle of 90° or greater, and prevents the introduction of water or moisture to the ceramic chip 110.

Fourthly, the insulation polymer coating layer 130 has a different color from that of the lead wire 120, to thereby efficiently check with the naked eye whether the insulation polymer coating layer 130 is reliably disposed on the lead wire 120.

Fifthly, since the insulation polymer coating layer 130 is continuously formed through a dipping process, its productivity and quality are improved.

Sixthly, since the insulation polymer coating layer 130 increases in thickness toward the insulation sealant 140 from the portion of the lead wire 120 exposed out of the insulation sealant 140, its productivity is improved, and the ceramic chip 110 can be reliably protected from an environmental change.

Seventhly, since the ceramic chip assembly 100 can be continuously fed to a reel taping process using carrier tape, its automation and productivity are improved.

A process of manufacturing the ceramic chip assembly 100 will now be described. While the lead wire 120 that is a single core having a circular cross-section is supplied in the form of a reel with carrier tape that is electrically insulated, a continuous forming process using the carrier tape is performed to form the lead wire 120 to have a certain physical shape, thereby forming a pair of the lead wires 120. Then, the external electrodes of the ceramic chip 110 between the lead wires 120 are brought to contact with the lead wires 120. Then, the ceramic chip 110 and the lead wires 120 are immersed into a container in which solder is melted, and a plurality of the lead wires 120 and a plurality of the external electrodes are continuously soldered to each other.

After that, a dipping process or injection process is performed to form a thermosetting insulation polymer resin such as epoxy or silicone rubber on the lead wires 120 connected to the ceramic chip 110 through the solder, thereby forming the insulation sealant 140. For example, liquid silicone rubber or epoxy powder may be formed on the lead wires 120 connected to the ceramic chip 110 through the solder, and then, be cured with heat to form the insulation sealant 140.

Thereafter, a dipping process is performed such that the whole of the insulation sealant 140 and the rest of the lead wires 120 exposed out of the insulation sealant 140 except for the uncoated ends are continuously dipped into a liquid insulation epoxy resin as a liquid insulation polymer resin that is prepared in advance in a certain container. Accordingly, the whole of the insulation sealant 140 and the portions of the lead wires 120 exposed out of the insulation sealant 140 are coated with the liquid insulation polymer resin.

For example, the insulation sealant 140 and the lead wire 120 may be sequentially dipped into the liquid insulation polymer resin.

The thickness of the insulation polymer coating layer 130 formed on the insulation sealant 140 and the lead wire 120 may be varied according to viscosity, dipping time, dipping depth, and processing speed of the liquid insulation polymer resin. For example, after curing, the liquid insulation polymer resin formed on the lead wire 120 may have a thickness for the lead wire 120 to withstand a voltage of about 100V or higher.

The length of the insulation polymer coating layer 130 formed on the lead wire 120 is varied according to the dipping depth. With respect to economic feasibility, the insulation polymer coating layer 130 formed on the lead wire 120 may have a length of about 10 mm or greater, but is not limited thereto.

As such, since the lead wires 120 are coated with the insulation polymer coating layer 130 through dipping, even when the portion of the lead wires 120 exposed out of the insulation sealant 140 is long, its productivity can be ensured.

The viscosity and processing speed of the liquid insulation polymer resin can be adjusted such that the lead wire 120 has acceptable flexibility and hardness, and the insulation polymer coating layer 130 has a thickness of about 0.3 mm or smaller.

For example, the insulation polymer coating layer 130 may have a viscosity ranging from about 3000 cps to about 50000 cps.

When the insulation sealant 140 and the lead wires 120 are dipped into liquid epoxy resin such that the insulation sealant 140 is disposed at the nearest level to a ground, and are taken out, the liquid epoxy resin having low viscosity flows down toward the ground by gravity. As a result, after curing the liquid epoxy resin, the insulation polymer coating layer 130 increases in thickness from the uncoated end of the lead wire 120 toward the insulation sealant 140.

Since the liquid epoxy resin flows down by gravity, the thickness of the insulation polymer coating layer 130 may be slightly varied along the length of the lead wire 120.

The amount of the liquid epoxy resin flowing down by gravity may be varied according to viscosity, dipping time, curing speed, and curing temperature of the liquid epoxy resin. For example, the insulation polymer coating layer 130 on the lead wire 120 may have a maximum thickness of about 0.3 mm such that the lead wire 120 withstands a voltage of about 100 V.

After that, the liquid epoxy resin formed on the insulation sealant 140 and the portions of the lead wires 120 exposed out of the insulation sealant 140 is cured to form the insulation polymer coating layer 130.

For example, the liquid epoxy resin may be cured with heat at a temperature of about 200° C. within one hour.

The curing temperature may be increased to reduce the curing time, and a primary curing process and a secondary curing process may be sequentially performed to improve the productivity.

Through a continuous manufacturing process as described above, the liquid epoxy resin is cured and adhered to the insulation sealant 140 and the portions of the lead wires 120, and the insulation polymer coating layer 130 is formed in a solid state with a thickness varied in the longitudinal direction of the lead wire 120.

As such, the insulation polymer coating layer 130 may be formed by sequentially dipping the insulation sealant 140 and the portions of the lead wires 120 into the liquid insulation polymer resin used for forming the insulation polymer coating layer 130, and curing the liquid insulation polymer resin formed on the insulation sealant 140 and the portions of the lead wires 120. In addition, the ceramic chip assembly 100 including the insulation polymer coating layer 130 having different thicknesses in both the portion adjacent to the uncoated end of the lead wire 120 and the portion adjacent to the insulation sealant 140 is continuously manufactured in the form of a reel with carrier tape (not shown).

After that, characteristics of the ceramic chip assembly 100 including the insulation polymer coating layer 130 and continuously manufactured in the form of a reel are continuously inspected.

As such, the ceramic chip assembly 100 continuously and automatically manufactured in the form of a reel with carrier tape includes the lead wire 120 that has a small thickness and that is economically and reliably formed, and the insulation sealant 140 and the exposed portions of the lead wires 120 are entirely coated, and thus, are reliably protected from an environmental change.

In addition, even when the exposed portions of the lead wires 120 are thin and long, the insulation polymer coating layer 130 formed on the exposed portions electrically insulates the lead wires 120 from each other.

Figure 6A:
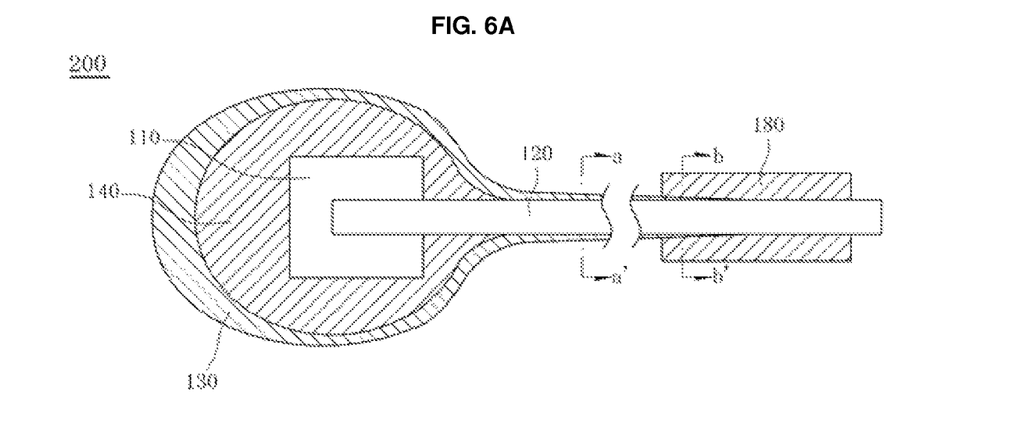
FIG. 6A is a cross-sectional view illustrating a ceramic chip assembly according to another embodiment of the present invention.
Figure 6B:
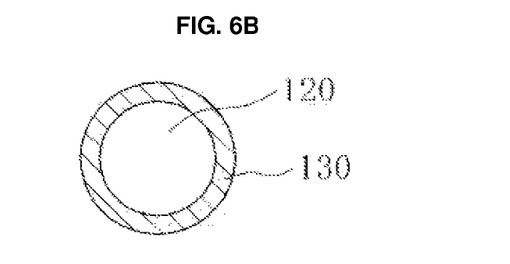
FIG. 6B is a cross-sectional view taken along line a-a' of FIG. 6A.
Figure 6C:
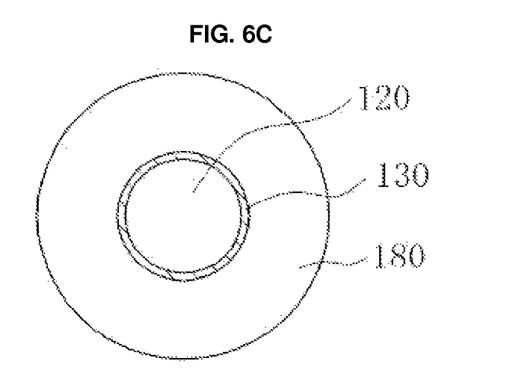
FIG. 6C is a cross-sectional view taken along line b-b' of FIG. 6A.

FIG. 6A is a cross-sectional view illustrating a ceramic chip assembly according to another embodiment of the present invention. FIG. 6B is a cross-sectional view taken along line a-a' of FIG. 6A. FIG. 6C is a cross-sectional view taken along line b-b' of FIG. 6A.

Referring to FIGS. 6A, 6B and 6C, an insulation tube 180 may be fitted on the lead wire 120 to cover a boundary between a portion coated with the insulation polymer coating layer 130 and an uncoated portion.

For example, the insulation tube 180 may be formed of silicone rubber having elasticity.

In this case, the insulation tube 180 is reliably and closely fitted on the lead wire 120 by its elasticity and elastic resilient force.

Substantially, the insulation tube 180 extends the coated portion of the lead wire 120 coated with the insulation polymer coating layer 130.

As such, the insulation tube 180 is fitted on an end of the coated portion of the lead wire 120 coated with the insulation polymer coating layer 130 to form a ceramic chip assembly 200 according to the current embodiment.

Figure 7:
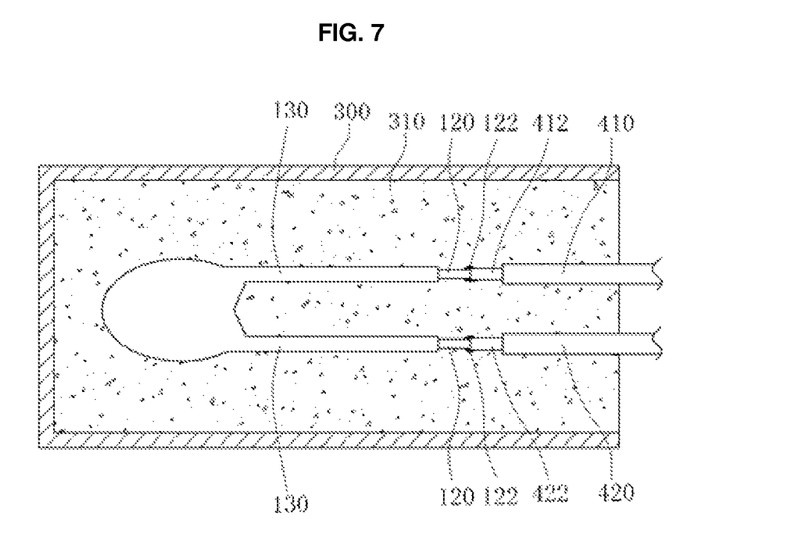
FIG. 7 is a plan view illustrating an application of a ceramic chip assembly according to an embodiment of the present invention.

FIG. 7 is a plan view illustrating an application of a ceramic chip assembly according to an embodiment of the present invention.

Referring to FIG. 7, exposed portions of the lead wires 120 are connected to leads 412 and 422 of connecting lines 410 and 420 through soldering or welding. Connecting tips 122 may have a convex shape on connecting areas between a plurality of the exposed portions and a plurality of the leads 412 and 422.

A metal can 300 accommodates the ceramic chip assembly 100 connected to the connecting lines 410 and 420, is filled with a liquid insulation sealant, and then, is cured to form an insulation sealant 310 that fixes and protects the ceramic chip assembly 100.

The insulation polymer coating layer 130 prevents electrical contact between the lead wires 120 due to filling pressure of the liquid insulation sealant.

That is, the lead wires 120 adjacent to each other are electrically insulated from each other by the insulation polymer coating layer 130.

For example, the metal can 300 may be formed of one of copper and aluminum having excellent thermal conductivity and elongation, but is not limited thereto.

For example, the insulation sealant 310 may be formed of one of materials used to form the insulation sealant 40, but is not limited thereto.

In another embodiment, an insulation tube (not shown) may be fitted on the connecting areas between a plurality of the exposed portions of the lead wires 120 out of the insulation polymer coating layer 130 and a plurality of the leads 412 and 422, thereby further improving the reliability of the ceramic chip assembly 100.

In anther embodiment, a ceramic chip assembly may be partially accommodated in the metal can 300 to expose partially the lead wires 120 out of the metal can 300.

As such, a ceramic chip assembly is accommodated in a metal can, and is sealed with an insulation sealant, thereby ensuring more reliable performance against an environmental change.

According to the embodiments, the following effects can be attained.

Firstly, an insulation polymer coating layer is reliably formed on a boundary between an exposed portion of a metal lead wire and an insulation sealant.

Secondly, a thin and flexible insulation polymer coating layer is formed on an exposed portion of a metal lead wire, so that the lead wire is electrically insulated from a conductive material facing the lead wire.

Thirdly, an insulation polymer coating layer is further formed on an insulation sealant to protect a ceramic chip in the insulation sealant.

Fourthly, even when an exposed portion of a metal lead wire is long, an insulation polymer coating layer can be efficiently formed on the metal lead wire.

Fifthly, a ceramic chip assembly is configured to prevent introduction of water and moisture to a ceramic chip.

Sixthly, two metal lead wires of a ceramic chip assembly can be spread without affecting a ceramic bare chip.

Seventhly, since a ceramic chip assembly is continuously fed to a reel taping process using carrier tape, its automation and productivity are improved.

Eighthly, since a ceramic chip assembly is accommodated in a metal can, reliable quality can be ensured against an environmental change.

While the present invention has been described in detail, it should be understood that various changes, substitutions and alterations can be made hereto without departing from the spirit and scope of the invention as defined by the appended claims.

What is claimed is:

1. A ceramic chip assembly comprising:
   a ceramic base having electrical characteristics;
   a pair of electrodes disposed on a pair of opposing surfaces of the ceramic base;
   a pair of metal lead wires having first ends electrically and mechanically connected to the electrodes, and second ends at opposite sides from the first ends of the metal lead wires;
   an insulation sealant covered to seal the ceramic base, the electrodes, and the first ends of the metal lead wires while exposing the metal lead wires adjacent the second ends thereof; and
   an insulation polymer coating layer covered on an entire external surface of the insulation sealant and portions of the metal lead wires exposed out of the insulation sealant except distal end portions at the second ends of the metal lead wires,
   wherein the insulation polymer coating layer has a varying thickness which gradually increases as it approaches from the distal end portions toward proximal portions of the metal lead wires, and defines a maximum thickness at a region of the insulation sealant opposite to the distal end portions of the metal lead wires.

2. The ceramic chip assembly of claim 1, wherein the ceramic base has an electrical performance of one of a thermistor, a capacitor, an inductor, and a piezoelectric.

3. The ceramic chip assembly of claim 1, wherein the insulation polymer coating layer has a lower hardness than that of the insulation sealant, and the insulation polymer coating layer has more flexibility than that of the insulation sealant.

4. The ceramic chip assembly of claim 3, wherein the insulation polymer coating layer has a certain hardness and flexibility to be free from a crack when the metal lead wires are bent about 90°, and to prevent introduction of water or moisture.

5. The ceramic chip assembly of claim 1, wherein an insulation tube is fitted on the metal lead wires to cover a boundary between a covered portion of the metal lead wires covered with the insulation polymer coating layer and an uncovered portion thereof.

6. The ceramic chip assembly of claim 1, wherein the varying thickness of the insulation polymer coating layer is made by dipping in liquid polymer with the insulation sealant orienting vertically toward a around side, and then curing the applied liquid polymer.

7. The ceramic chip assembly of claim 1, wherein each of the metal lead wires has one of a circular cross-section, a rectangular cross-section, and a combination thereof.

8. The ceramic chip assembly of claim 1, wherein an outermost layer of the metal lead wires is plated with one of stannum and silver, and has a circular cross-section with an outer diameter ranging from about 0.1 mm to about 0.6 mm.

9. The ceramic chip assembly of claim 1, wherein the insulation polymer coating layer has an overall length of about 10 mm or greater.

10. The ceramic chip assembly of claim 1, wherein the insulation polymer coating layer comprises one of epoxy, polyimide, polyamide, polyester, urethane, and silicone.

11. The ceramic chip assembly of claim 1, wherein the insulation polymer coating layer has a different color from that of the metal lead wires.

12. The ceramic chip assembly of claim 1, wherein the insulation polymer coating layer is adhered to the insulation sealant and the metal lead wires.

13. The ceramic chip assembly of claim 1, wherein the insulation polymer coating layer has a maximum thickness of about 0.3 mm, or the minimum of thicknesses for the metal lead wires to withstand a voltage of about 100 V or higher.

14. The ceramic chip assembly of claim 1, wherein the ceramic chip assembly is continuously supplied in the form of reel taping with carrier tape.

15. The ceramic chip assembly of claim 1, further comprising:
 a metal can accommodating the ceramic chip assembly therein; and
 an insulation sealant filled in an inner space of the metal can to further seal and protect the ceramic chip assembly from environment.

16. A method of manufacturing a ceramic chip assembly, the method comprising:
 electrically and mechanically connecting first ends of a pair of metal lead wires to a pair of electrodes on opposing surfaces of a ceramic base;
 sealing the ceramic base, the electrodes, and the first ends of the metal lead wires with an insulation sealant while exposing second ends of the metal lead wires;
 dipping the insulation sealant and portions of the metal lead wires into a liquid insulation polymer resin having a predetermined viscosity, with the insulation sealant orienting vertically toward a ground side to allow the viscous liquid insulation polymer resin to partly flow downwards by gravity to enable the applied liquid insulation polymer resin to have a varying thickness which gradually increases as it approaches from the second ends toward the first ends of the metal lead wires and defines a maximum thickness at a region of the insulation sealant opposite to the second ends of the metal lead wires;
 taking out the insulation sealant and the portions of the metal lead wires; and
 curing the liquid insulation polymer resin formed on the insulation sealant and the portions of the metal lead wires.

* * * * *